United States Patent [19]

Wakui et al.

[11] Patent Number: 5,504,407
[45] Date of Patent: Apr. 2, 1996

[54] STAGE DRIVING SYSTEM

[75] Inventors: Shinji Wakui; Mikio Sato, both of Kawasaki; Katsumi Asada, Yokohama, all of Japan

[73] Assignee: Canon Kabushiki Kaisha, Tokyo, Japan

[21] Appl. No.: 19,579

[22] Filed: Feb. 18, 1993

[30] Foreign Application Priority Data

Feb. 21, 1992 [JP] Japan .................................. 4-070070
Mar. 9, 1992 [JP] Japan .................................. 4-084974

[51] Int. Cl.⁶ ............................................. G06F 15/46
[52] U.S. Cl. ................ 318/568.17; 318/592; 318/611; 318/623
[58] Field of Search ........................ 318/518.17, 561, 318/590, 592, 593, 595, 648, 649, 651, 640, 623, 611; 310/51; 364/474.28, 474.3

[56] References Cited

U.S. PATENT DOCUMENTS

| 3,656,014 | 4/1972 | Rich | 318/623 |
|---|---|---|---|
| 3,904,945 | 9/1975 | Hassan et al. | 318/593 |
| 4,525,659 | 6/1985 | Imahashi et al. | 318/649 |
| 4,653,903 | 3/1987 | Torigoe et al. | |
| 4,843,293 | 6/1989 | Futami | 318/593 X |
| 4,929,874 | 5/1990 | Mizuno et al. | 318/849 |
| 4,952,858 | 8/1990 | Galburt | 318/567 |
| 5,008,606 | 4/1991 | Koehler et al. | 318/649 |
| 5,055,760 | 10/1991 | Nashiki et al. | 318/687 |
| 5,153,494 | 10/1992 | Hollis, Jr. | 318/640 |
| 5,187,519 | 2/1993 | Takabayashi et al. | 355/53 |
| 5,208,497 | 5/1993 | Ishii et al. | 310/51 |
| 5,260,580 | 11/1993 | Itoh et al. | 250/492.2 |
| 5,315,526 | 5/1994 | Maeda et al. | 318/593 X |
| 5,432,422 | 7/1995 | Nagano et al. | 318/611 |

FOREIGN PATENT DOCUMENTS

| 0393994 | 10/1990 | European Pat. Off. . |
|---|---|---|
| 0502578 | 9/1992 | European Pat. Off. . |
| WO9301021 | 1/1993 | WIPO . |

OTHER PUBLICATIONS

Japanese Society for Precision Engineering, "Air Bearing Guided High Speed XY Stage", by Hiroo Kinoshita, et al., Oct. 1986, pp. 47–52.
Patent Abstracts of Japan, vol. 7, No. 78 (P–188) published Mar. 31, 1983, English Abstract of Japanese Patent No. 58–009133.

*Primary Examiner*—Brian Sircus
*Attorney, Agent, or Firm*—Fitzpatrick, Cella, Harper & Scinto

[57] ABSTRACT

A stage driving system capable of positioning an object with a higher speed and a higher precision than prior systems. The system includes a base member, plural movable members provided on the base member, and a controller for controlling the plural movable members so as to substantially suppress the vibration of the base member caused by the displacements of the plural movable members.

10 Claims, 12 Drawing Sheets

100 [msec]

100 [msec]

100 [msec]

STAGE DRIVING SYSTEM

BACKGROUND OF THE INVENTION

1. Field of the Invention

The present invention relates to a stage driving system, and more particularly to a stage driving system for moving a movable stage, supporting an article to be worked or exposed or a specimen, positioning the same at a target position, adapted for use in an exposure apparatus or a working apparatus employed for producing a semiconductor device, an image pickup device, a display device, a magnetic head or the like, or in an observing apparatus such as an electron microscope.

2. Related Background Art

In the electron microscope employing an electron beam or in the exposure apparatus for semiconductor device manufacture such as a stepper, there is employed a configuration in which a positioning device for the specimen or the work piece is loaded on an antivibration device. The positioning device is usually composed of an X-Y stage which is driven in two horizontal directions. The antivibration device has a function of attenuating the vibrations by vibration absorbing means, such as an air spring, a coil spring, antivibration rubber etc. However, such an antivibration device can attenuate, to a certain extent, the vibrations transmitted from the floor, but is incapable of effectively attenuating the vibrations generated by the positioning device itself loaded on the antivibration device. More specifically, the reaction generated by the high-speed movement of the positioning device itself causes a vibration in the antivibration device, thereby hindering the high-speed and high-precision positioning of the positioning device.

For example, FIG. 1 shows an error signal in a position control system when a positioning device (movable stage) loaded on a base plate equipped with an antivibration device is step driven. As shown in FIG. 1, in the initial stage, there appears a transient vibration of the natural frequency of the position control system. This vibration however attenuates relatively quickly, and the vibration of the natural frequency of the base plate overlaps the subsequent signal for a long period, thus prolonging the time required for positioning.

This phenomenon can be quantified by a dynamic model of the movable stage loaded on the base plate in the following manner.

FIG. 2 shows a dynamic model of an X-Y stage 1 loaded on a base plate 2, represented to travel in a horizontal axis such as the X- or Y-direction. The dynamic model has two degrees of freedom, including the base plate 2 and the stage 1. The equations of motion of the stage can be represented in the following manner, utilizing the symbols shown in FIG. 1:

$$m_1 \ddot{x}_1 + b_1(\dot{x}_1 - \dot{x}_2) + k_1(x_1 - x_2) = f_1 \quad (1a)$$

$$m_2 \ddot{x}_2 + b_2 \dot{x}_2 + k_2 x_2 + b_1(\dot{x}_2 - \dot{x}_1) + k_1(x_2 - x_1) = -f_1 \quad (1b)$$

where the symbols used therein have the following meanings:

- $m_1$: mass of stage [kg]
- $m_2$: mass of base plate [kg]
- $b_1$: viscous friction coefficient of stage [Ns/m]
- $b_2$: viscous friction coefficient of base plate [Ns/m]
- $k_1$: spring constant of stage [N/m]
- $k_2$: spring constant of base plate [N/m]
- $x_1$: displacement of stage [m]
- $x_2$: displacement of base plate [m], and
- $f_1$: driving force [N].

The foregoing equations can be represented, in a block diagram, by an area 3 surrounded by a broken line in FIG. 3, in which the area 3 indicates the controlled object (object to be controlled), and the part outside the area indicates a position control system block, including a position detection/conversion means 4, a compensator 5 for improving the characteristics of the position control system, a power amplifier 6, and an actuator 7. The position detection/conversion means 4 includes a stage position detector such as a laser interferometer, and a counter.

The system shown in FIG. 3 functions in the following manner. At first the position $(x_1-x_2)$ is detected, and the error(deviation) $x_0-(x_1-x_2)$ between the detected position and the target position $x_0$ is multiplied by a positional gain $k_p$ of the position detection/conversion means 4. The obtained output drives the power amplifier 6 through the compensator 5 for improving the characteristics of the position control system. Finally a driving force $f_1$ is generated by way of a conversion by the thrust constant $k_t$ of the actuator 7 driving the positioning device.

The feedback detection of position is represented as $(x_1-x_2)$ because the laser interferometer constituting the position detection means is usually mounted on the base plate 2. Also, in the illustrated configuration, the compensator 5 for improving the characteristics of the position control system consists of a PID compensator (P: proportional operation, I: integrating operation, D: differentiating operation). The symbols in FIG. 3 have following meanings and dimensions:

$K_p$: positional gain [V/m], $F_x$: P-operation gain [V/V], $F_i$: I-operation gain [V/V·sec], $F_v$: D-operation gain [V·sec/V], $K_i$: driver gain [A/V], $T_d$: time constant of driver [sec], $K_t$: thrust constant [N/A], and s: Laplace operator [rad/sec].

For suppressing the influence of the reaction by driving the stage 1 at the position $(x_1-x_2)$, a method of detecting the acceleration of the base plate 2 and feeding back a signal, corresponding to the acceleration, to the input of the power amplifier 6 for driving the stage 1 has been disclosed in "Trial manufacture of Air Bearing Guided High Speed XY Stage", Journal of Society of Precision Engineering, 52-10, '86-10-1713.

SUMMARY OF THE INVENTION

The object of the present invention is to provide a driving system capable of positioning an object with a higher speed and a higher precision than conventional devices.

A first embodiment of the present invention comprises a base member, plural movable members provided on the base member, and control means for controlling the plural movable members in such a manner as to substantially suppress the vibration of the base member, by resulting from the displacement of the plural movable members.

A second embodiment of the present invention comprises a base member, plural movable members provided on the base member, and control means for controlling the displacement of the plural movable members in such a manner that the vibration of the base member, caused by one of the plural movable members is substantially cancelled by the vibration of the base member caused by the remaining ones of the plural movable members.

A third embodiment of the present invention comprises a base member, a first movable member provided on the base member, a second movable member movable relative to the first movable member provided on the first movable member, first detection means for detecting the acceleration of the first movable member, and control means for controlling the displacement of the second movable member by utilizing the acceleration information detected by the first detection means.

A fourth embodiment of the present invention comprises a base member, a first movable member provided on the base member, a second movable member movable relative to the first movable member provided on the first movable member, first detection means for detecting the acceleration of the base member; second detection means for detecting the acceleration of the first movable member, and control means for controlling the displacement of the second movable member by utilizing the acceleration information detected by the first detection means, in such a manner as to shorten the time required for positioning the second movable member to a target position.

A fifth embodiment of the present invention comprises a base member, a first movable member provided on the base member, a second movable member movable relative to the first movable member provided on the first movable member, first detection means for detecting the acceleration of the base member, second detection means for detecting the acceleration of the first movable member, and control means for controlling the displacement of the second movable member by utilizing the acceleration information detected by the second detection means, in such a manner as to shorten the time required for positioning the second movable member to a target position, and also controlling the displacement of the first movable member by utilizing the acceleration information of the base member detected by the first detection means in such a manner as to shorten the time required for positioning the first movable member to a target position.

A preferred aspect in the foregoing first, second, third or fourth embodiment of the present invention includes a shock absorbing device for supporting the base member.

The present invention provides an exposure apparatus for producing a memory device, an image pickup device, a display device or a magnetic head, equipped with a driving system according to any of foregoing embodiments.

DETAILED DESCRIPTION OF THE PREFERRED EMBODIMENTS

A first embodiment of the present invention provides a composite (multiple) positioning device in which at least two movable stages are loaded on a base plate supported by an antivibration device and are driven in synchronization in such a manner that the reactive force of the movable stages mutually cancel each other out. In a conventional positioning device, the driving force for a single stage is applied, as a reactive force, to the base plate supported by the antivibration device. According to the present invention there is provided a composite positioning device provided with a base plate supported by an antivibration device, at least two positioning devices loaded on said base plate, speed/position control devices for driving the positioning devices, and a synchronized controller for driving the speed/position control devices in synchronization in such a manner that stages constituting the positioning devices mutually coincide in the start of of acceleration and deceleration, and also mutually coincide in the absolute value of the impulse which is the product of the accelerating or decelerating time and the driving force, but are mutually opposite in the sign of the impulse.

Figure 5:
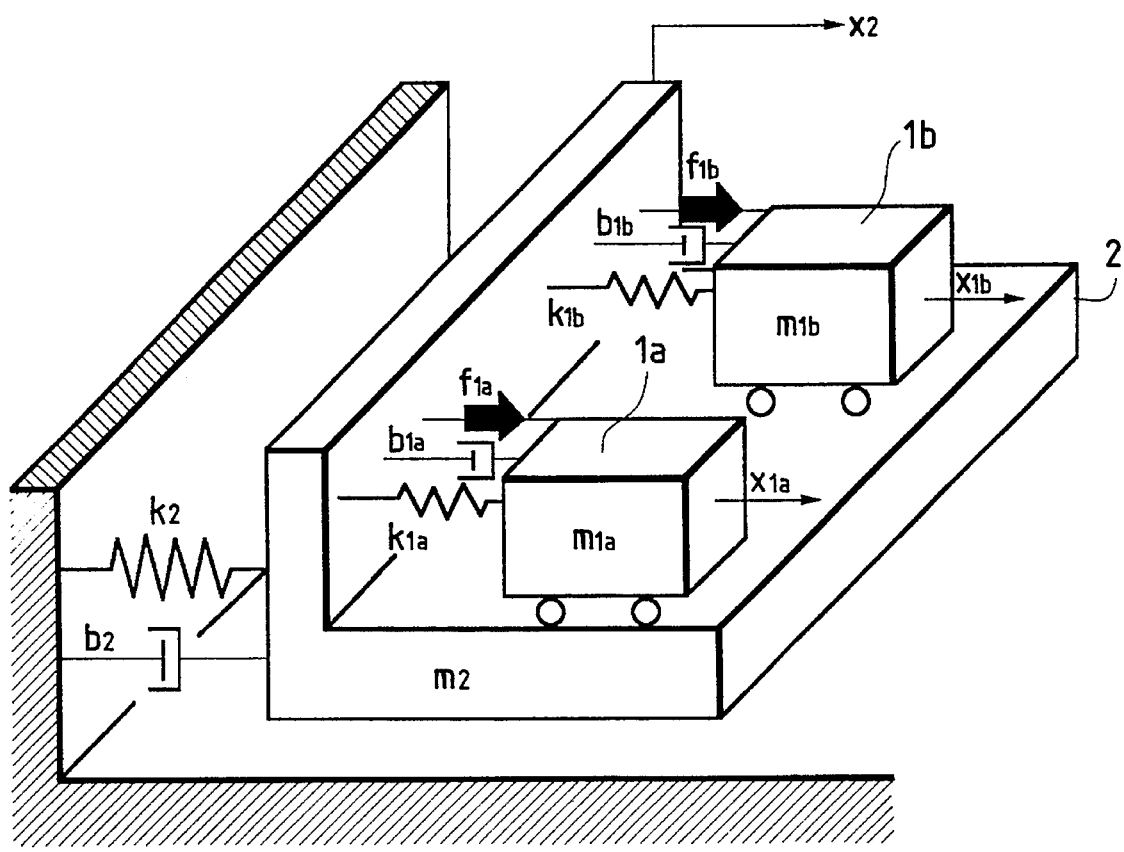
FIG. 5 is a schematic view showing a dynamic model of two movable stages loaded on a base plate, in a horizontal direction.

FIG. 5 shows a dynamic model of two movable stages loaded on the base plate, in the present embodiment. Equations of motion for stages $1a$, $1b$ loaded on a base plate 2 are as follows:

$$m_{1a}\ddot{x}_{1a} + b_{1a}(\dot{x}_{1a} - \dot{x}_2) + k_{1a}(x_{1a} - x_2) = f_{1a} \quad (2a)$$

$$m_{1b}\ddot{x}_{1b} + b_{1b}(\dot{x}_{1b} - \dot{x}_2) + k_{1b}(x_{1b} - x_2) = f_{1b} \quad (2b)$$

$$m_2\ddot{x}_2 + b_2\dot{x}_2 + k_2x_2 + b_{1a}(\dot{x}_2 - \dot{x}_{1a}) + k_{1a}(x_2 - x_{1a}) + \quad (2c)$$

$$b_{1b}(\dot{x}_2 - \dot{x}_{1b}) + k_{1b}(x_2 - x_{1b}) = -f_{1a} - f_{1b}$$

Figure 6:
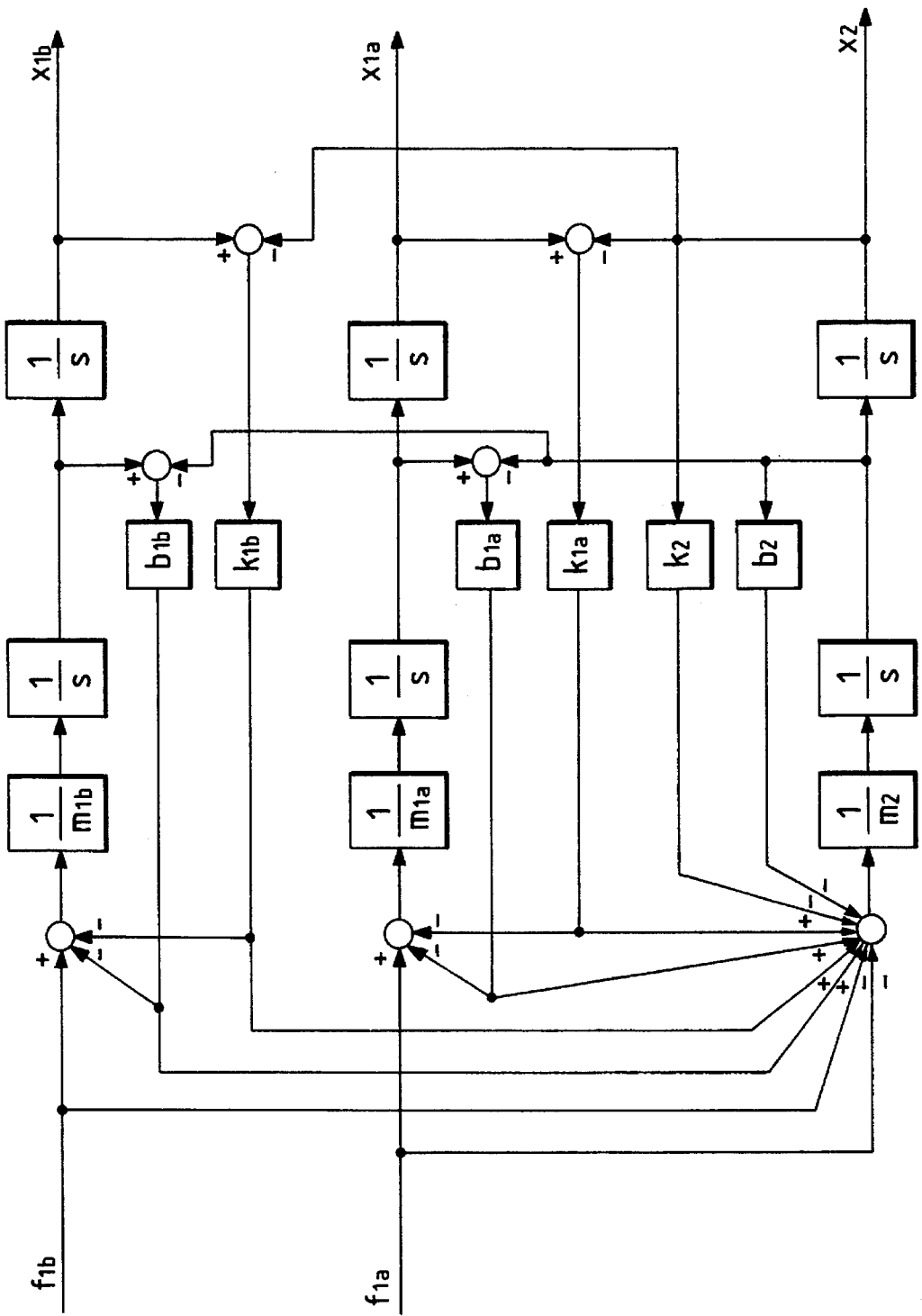
FIG. 6 is a block diagram showing the equations of motion of two movable stages loaded on a base plate.

The foregoing equations can be represented by a block diagram shown in FIG. 6. The total reactive force acting on the base plate 2, resulting from the driving of the stages $1a$ and $1b$, is the sum of the reactive forces thereof with a negative sign, as indicated in the right-hand side of the equation (2c), and acts on the base plate as a driving force to move the same. The right-hand side of the equation (2c) becomes zero if the stages are so driven as to satisfy:

$$f_{1a} = -f_{1b} \tag{3}$$

and the driving force for moving the base plate no longer exist under such a condition. The equation (3) means that the stages 1a and 1b are driven under the same conditions but in mutually opposite directions.

Figure 4:
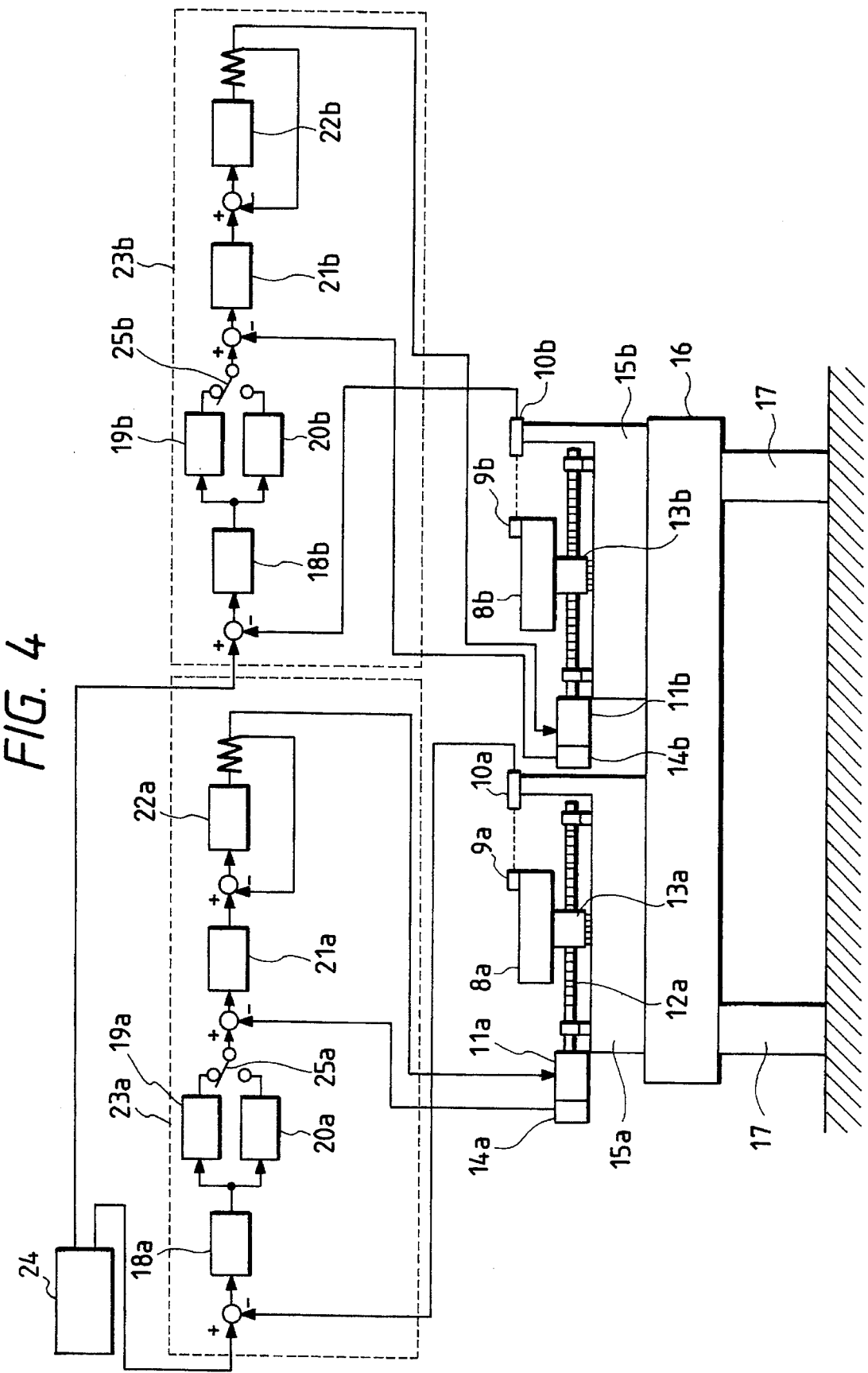
FIG. 4 is a schematic view showing schematic configuration of an embodiment of the present invention.

FIG. 4 is a schematic view of a multiple positioning device constituting an embodiment of the present invention, wherein wafer stages 8a, 8b to be positioned are equipped thereon with mirrors 9a, 9b for position measurement with laser interferometers 10a, 10b. The rotation of DC motors 11a, 11b equipped with tachogenerators 14a, 14b is transmitted to ball screws 12a, 12b to linearly drive the stages 8a, 8b through nuts 13a, 13b.

Wafers loaded on the stages 8a, 8b (a wafer being loaded only on any one of the stages in a certain case) are positioned with respect to masks (not shown), and are exposed to the light transmitted by way of circuit patterns on the masks.

The DC motors 11a, 11b, tachogenerators 14a, 14b, ball screws 12a, 12b, nuts 13a, 13b and stages 8a, 8b constitute two positioning devices loaded on the stage base plates 15a, 15b. The positioning devices are mounted on a base plate 16 constituting a main body supported by an antivibration device 17 for isolating (intercepting) the floor vibration.

The control device for driving the stages 8a, 8b will now be explained. Digital-to-analog converters (DAC) 18a, 18b process the error represented by the difference. Between the outputs of the laser interferometers 10a, 10b and a target value. The outputs of the D/A converters 18a, 18b are supplied to both position controllers 19a, 19b and amplifiers 20a, 20b. In the speed mode, the outputs of the amplifier 20a, 20b or in the position mode operation, the outputs of the position controllers 19a, 19b are respectively selected by electronic switches 25a, 25b.

Drive speed controllers 21a, 21b and current controllers 22a, 22b are connected after the electronic switches 25a, 25b are connected, so that they are driven in order. Thus the DAC 18a, 18b, position controllers 19a, 19b, amplifiers 20a, 20b, electronic switches 25a, 25b, speed controllers 21a, 21b and current controllers 22a, 22b constitute the speed/position control devices 23a, 23b.

In the above-explained configuration, the speed/position control device 23a for driving the stage 8a and the speed/position control device 23b for driving the stage 8b are both controlled by a synchron controller 24. In this embodiment, synchron control is executed in such a manner that the stages 8a, 8b are driven in mutually opposite directions. More specifically, the stages 8a and 8b are both driven in the speed mode for the most part of the moving stroke thereof, and are then switched to the position mode when they come close to the target positions, and are finally positioned at the target positions. In these operation modes, the speed mode consists of three periods of acceleration, constant speed and deceleration, and the reactive force for driving the stage are principally generated in the accelerating and decelerating periods. Therefore, the synchron controller 24 controls the driving of the stages 8a, 8b in such a manner that they mutually coincide in the start timing of acceleration and deceleration and in the impulse which is the product of the duration of acceleration or deceleration and the driving force generated by the current controller 22a, 22b, but are mutually opposite in the sign of the impulse. In this manner, as already explained in FIGS. 5 and 6, the reactive forces of the stages 8a, 8b with respect to the base plate 16 mutually cancel, each other out so that the vibration thereof caused by the stages 8a, 8b is suppressed.

In the above-explained embodiment, two positioning devices of almost the same characteristics are mounted on the base plate and are driven under the control of the synchron controller 24. In more detail, the stages 8a, 8b are substantially the same in their mass, the DC motors 11a, 11b are almost the same kind, and the mechanisms composed of the ball screws 12a, 12b and the nuts 13a, 13b are substantially the same in their viscous friction, static friction, spring constant and driving pitch.

However, there may be adopted other configurations as long as the vibration of the base plate can be suppressed by mutual cancellation of the reactive forces generated by the stages, as shown in the equation (3). Namely, the positioning devices need not be of same characteristics, and the stages 8a and 8b may be different in their masses. Two stages need only to be driven with coinciding timing of the acceleration and deceleration and with a same absolute value of the impulse at the acceleration and deceleration but with opposite signs of the impulse.

The two positioning devices shown in FIG. 4 are both provided with moving mechanisms composed of the DC motors 11a, 11b, tachogenerators 14a, 14b, ball screws 12a, 12b, nuts 13a, 13b and stages 8a, 8b, but the mechanisms are naturally not limited to these elements. For example any of the positioning devices is provided with a ball screw and a nut for movement conversion, while the other may employ a linear motor such as the actuator, with the movement conversion mechanism.

Figure 1:
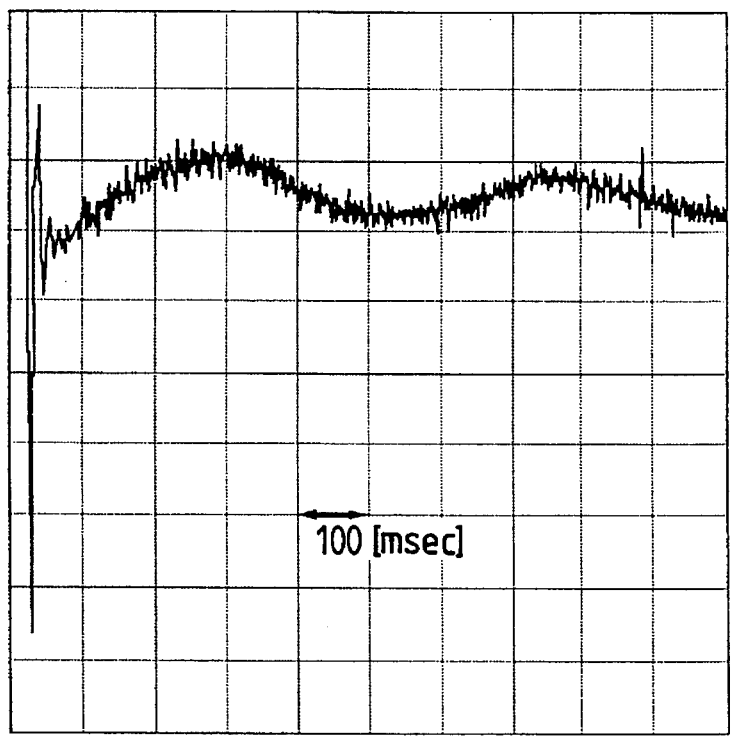
FIG. 1 is a waveform chart showing the step response of a movable stage loaded on a base plate.

In the foregoing there is provided a composite positioning device in which at least two stages are loaded on a base plate and are driven in a synchron manner so that their reactive forces mutually cancel each other, whereby the base plate does not vibrate. Since the base plate is no longer excited in response to vibration, the vibration of the base plate is not superposed on the positioning waveform of the stage as shown in FIG. 1, so that the time required for positioning can be shortened. Also since two stages are loaded on the same base plate, the required floor area can be economized in comparison with the case of employing plural sets of the apparatus each including one stage on the base plate. Furthermore, the transporting apparatus for handling the object to be loaded on the stage has been required for each unit, but, in the present invention, there is only required a transporting apparatus for a composite positioning device including at least two stages, so that the cost can be reduced without an increase in the required floor space.

Furthermore, since it is no longer necessary to consider the antivibration problem resulting from the driving of the stages, the base plate can be designed solely in consideration of the elimination of vibration and can achieve highly effective elimination of vibration.

Figure 2:
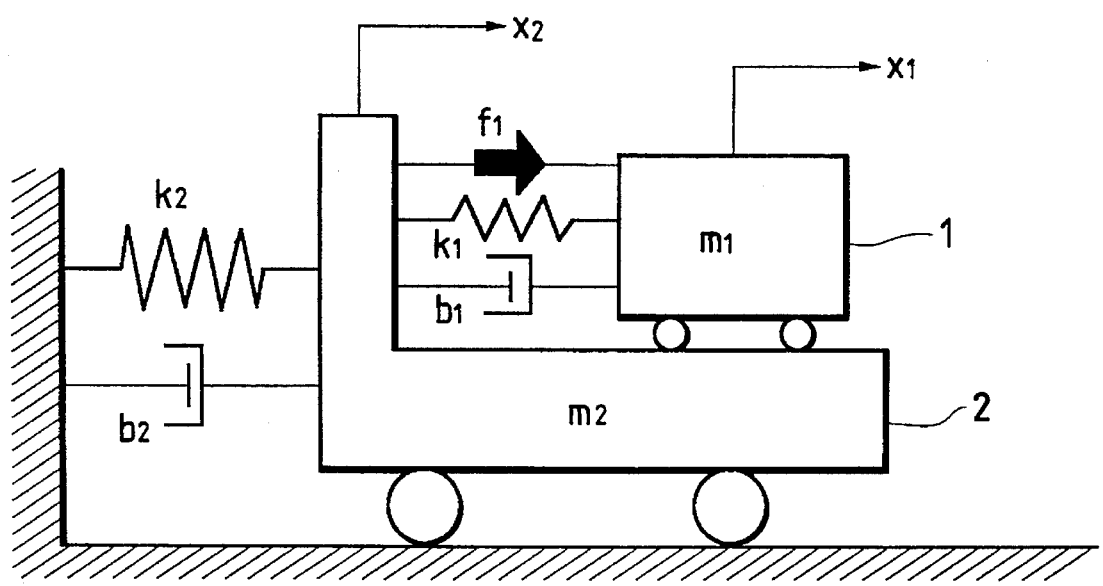
FIG. 2 is a schematic view showing a dynamic model of a movable stage loaded on a base plate, in a horizontal direction.
Figure 3:
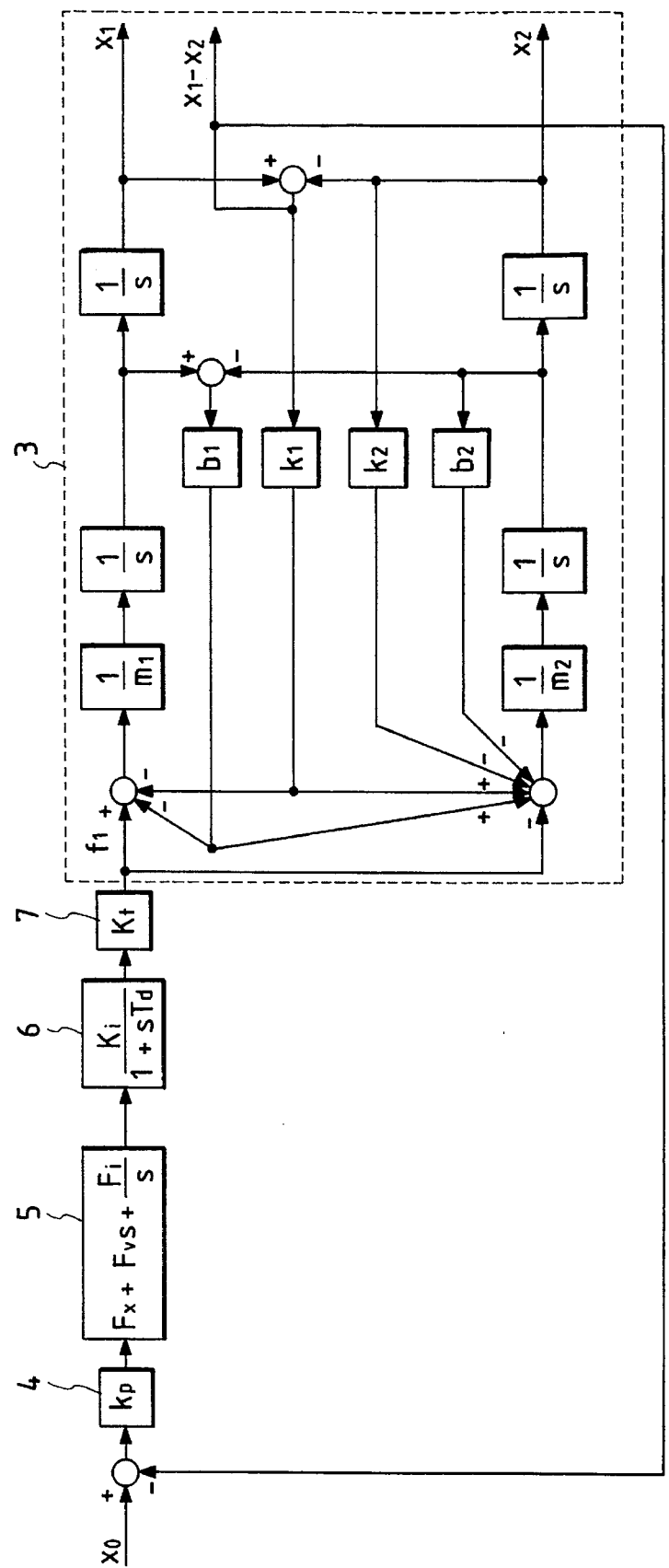
FIG. 3 is a block diagram showing a position control system for a movable stage loaded on a base plate.

For the dynamic model of two degrees of freedom including the base plate 2 shown in FIG. 2 and the stage 1 shown in FIG. 2, there are obtained following equations of motion, in consideration of the external perturbation:

$$m_1\ddot{x}_1 + b_1(\dot{x}_1 - \dot{x}_2) + k_1(x_1 - x_2) = f_1 \tag{3a}$$

$$m_2\ddot{x}_2 + b_2\dot{x}_2 + k_2 x_2 + b_1(\dot{x}_2 - \dot{x}_1) + k_1(x_2 - x_1) = -f_1 + f_{ext} \tag{3b}$$

wherein the symbols used therein have the following meanings:

$m_1$: mass of coarse movement stage [kg]

$m_2$: mass of base plate [kg]

$b_1$: viscous friction coefficient of coarse movement stage [Ns/m]

$b_2$: viscous friction coefficient of base plate [Ns/m]

$k_1$: spring constant of coarse movement stage [N/m]

$k_2$: spring constant of base plate [N/m]

$x_1$: displacement of coarse movement stage [m]

$x_2$: displacement of base plate [m]

$f_1$: driving force for coarse movement stage [N]

$f_{ext}$: disturbance [N]

Figure 7:
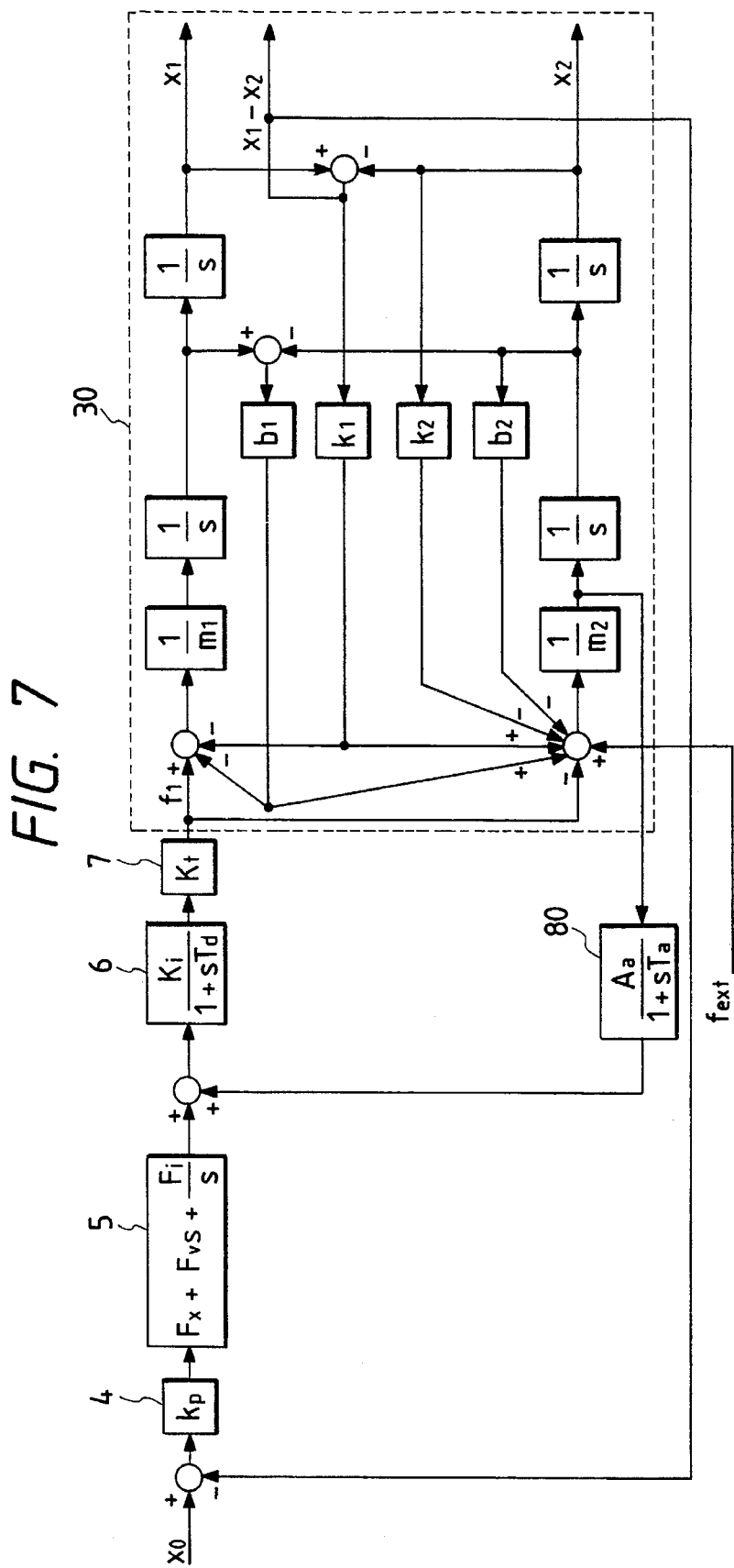
FIG. 7 is a block diagram showing the position control of a movable stage loaded on a base plate, in which the acceleration signal of the base plate is used as a feedback signal.

The foregoing equations can be represented, in a block diagram, by a controlled object 30 shown by a broken-lined frame in FIG. 7. Below are defined relations among $f_1$, $f_{ext}$, $x_1$ and $x_2$, wherein s stands for a Laplace operator:

$$x_1 = \{(m_2 s^2 + b_2 s + k_2) f_1 + (b_1 s + k_1) f_{ext}\}/g(s) \quad (4a)$$

$$x_2 = \{m_2 s^2 f_1 + (m_1 s^2 + b_1 s + k_1) f_{ext}\}/g(s) \quad (4b)$$

$$g(s) = (m_1 s^2 + b_1 s + k_1)\{m_2 s^2 + (b_1 + b_2)s + (k_1 + k_2)\} - (b_1 s + k_1)^2 \quad (4c)$$

Thus the relative displacement $(x_1-x_2)$ can be defined from $f_1$ and $f_{ext}$ as following equation. The position is detected by the relative displacement $(x_1-x_2)$ because, as already explained above, the laser interferometer for position detection is mounted on the base plate 2.

$$(x_1 - x_2) = \{[(m_1 + m_2)s^2 + b_2 s + k_2]f_1 - m_1 s^2 f_{ext}\}/\{(m_1 s^2 + b_1 s + k_1)[m_2 s^2 + (b_1 + b_2)s + (k_1 + k_2)] - (b_1 s + k_1)^2\} \quad (5)$$

In the following, the effect of feedback in the acceleration of the base plate, disclosed in the aforementioned reference "Trial munufacturing of Air Beating Guided High Speed XY Stage" (JSPE-52-10, '86-10-1713) will be considered, based on the equations of motion.

At first there stand the following equations of motion:

$$m_1 \ddot{x}_1 + b_1(\dot{x}_1 - \dot{x}_2) + k_1(x_1 - x_2) = f_1 + A\ddot{x}_2 \quad (6a)$$

$$m_2 \ddot{x}_2 + b_2 \dot{x}_2 + k_2 x_2 + b_1(\dot{x}_2 - \dot{x}_1) + k_1(x_2 - x_1) = -(f_1 + A\ddot{x}_2) + f_{ext} \quad (6b)$$

An equation corresponding to (5) can be represented in the following manner:

$$(x_1 - x_2) = \{[(m_1 + m_2)s^2 + b_2 s + k_2]f_1 + (A - m_1)s^2 f_{ext}\}/\{(m_1 s^2 + b_1 s + k_1)[m_2 s^2 + (b_1 + b_2)s + (k_1 + k_2)] - (b_1 s + k_1)(As^2 + b_1 s + k_1)\} \quad (7)$$

As will be apparent from the foregoing equation, the influence of the disturbance $f_{ext}$ on the relative displacement $(x_1-x_2)$ can be made zero by selecting the acceleration feedback gain A as:

$$A = m_1 \quad (8)$$

The relation of the foregoing equation (8) is discussed in the absence of a position control loop for the controlled object 30, but the equation (8) can also be derived in case a position control loop is constructed. For the purpose of this confirmation, there will be explained below the extent of alleviation of the influence of the disturbance $f_{ext}$ $f_{ext}$ on the relative displacement $(x_1-x_2)$ in case the feedback is applied to the acceleration of the base plate.

In FIG. 7, there are shown a controlled object 30, a position detection/conversion means 4, a compensator 5 for improving the characteristics of the position control system, a power amplifier 6, a thrust constant 7 of the actuator, and a base plate acceleration feedback circuit 80. The position detection/conversion means 4 includes a position detector such as a laser interferometer and a counter.

The circuit shown in FIG. 7 functions in the following manner. At first the relative displacement $(x_1-x_2)$ is detected, and the error $x_0-(x_1-x_2)$ from the target position $x_0$ is multiplied by the position gain $K_p$ of the position detection/conversion means 4. The obtained output drives the power amplfier 6 through the compensator 5 for improving the characteristics of the position control system, thereby finally generating a driving force $f_1$ through the conversion by the thrust constant $K_t$ of the actuator for driving the stage 1. In the configuration shown in FIG. 7, the compensator is composed of a PID compensator, wherein P denotes a proportional operation, I denotes an integrating operation and D denotes a differentiating operation. Also the illustrated symbols have following meanings and dimensions:

| | | |
|---|---|---|
| $K_p$: positional gain | | [V/m] |
| $F_x$: P-operation gain | | [V/V] |
| $F_i$: I-operation gain | | [V/Vsec] |
| $F_v$: D-operation gain | | [Vsec/V] |
| $K_i$: power amplifier gain | | [A/V] |
| $T_d$: time constant of power amplifier | | [sec] |
| $K_t$: thrust constant | | [N/A] |
| $A_a$: base plate acceleration feedback gain | | [V/m/sec$^2$] |
| $T_a$: time constant of acceleration signal | | [sec] |

On the position control system shown in FIG. 7, the transfer function from the target position $x_0$ and the disturbance $f_{ext}$ to the relative displacement $(x_1-x_2)$ is represented by the following equations, in which the base plate acceleration feedback circuit 8 is not yet applied:

$$(x_1 - x_2) = \{K_p K_t K_i [(m_1 + m_2)s^2 + b_2 s + k_2](F_v^2 + F_{xs} + F_i)x_0 - m_1 s^3(1 + sT_d)f_{ext}\}/\{sg''(s) + K_p K_t K_i [(m_1 + m_2)s^2 + b_2 s + k_2](F_{vs}^2 + F_{xs} + F_i)\} \quad (9a)$$

$$g''(s) = (1 + sT_d)g(s) \quad (9b)$$

Then the relation when the base plate acceleration feedback circuit 8 is activated is represented by the following equations:

$$(x_1 - x_2) = \{K_p K_t K_i (1 + sT_a)[(m_1 + m_2)s^2 + b_2 s + k_2](F_{vs}^2 + F_{xs} + F_i)x_0 + s[K_t K_i A_a s^2 - m_1 s^2(1 + sT_a)(1 + sT_d)]f_{ext}\}/\{sg'(s) + K_p K_t K_i (1 + sT_a)[(m_1 + m_2)s^2 + b_2 s + k_2](F_{vs}^2 + F_{xs} + F_i)\} \quad (10a)$$

$$g'(s) = (1 + sT_a)(1 + sT_d)g(s) + A_a K_t K_i m_1 s^4 \quad (10b)$$

These equations (10a) and (10b) indicate that the positioning time is the sum of the response from the target position $x_0$ and that from the disturbance $f_{ext}$. It is consequently important, not only for reducing the positioning time but also for securing the accuracy of positioning, to suppress the influence of the disturbance on the relative displacement $(x_1-x_2)$.

Now, let us consider the response to the disturbance $f_{ext}$ only in the equation (10a) by substituting $x_0=0$. In the polynomial of the denominator of the term representing the disturbance the interior of the parentheses [] is:

$$K_t K_i A_a s^2 - m_1 s^2 (1 + sT_a)(1 + sT_d) \quad (11)$$

Consequently, the response to the disturbance $f_{ext}$ can be considerably reduced in comparison with the case of (9a), by setting the base plate acceleration feedback gain $A_a$ according to following equation:

$$A_a = m_1 / K_t K_i \quad (12)$$

This equation is similar, in meaning, to the equation (8). More specifically, in the equation (8), the feedback gain A for the base plate acceleration is represented as a unit of mass, but, in the case of the equation (12), the acceleration detection gain $A_a$ is represented as a unit of V/m/sec$^2$, and the gain and the time constant of the power amplifier 6 for generating the driving force are taken into consideration. Consequently there is no basic difference, and the above-mentioned equations are mutually equivalent if the following relation is assumed:

$$A = A_a K_t K_i \tag{13}$$

The foregoing analysis indicates that the effect of the acceleration feedback for reducing the influence of the disturbance $f_{ext}$ on the relative position ($x_1 - x_2$) may be discussed in the presence of a control loop such as a position control system, but can also be discussed, for the purpose of simplicity, for a configuration including the controlled object only, not involving the control loop. In summary, there has been illustrated, in the case in which a stage is loaded on a base plate, the effect of feedback on base plate acceleration for reducing the influence of the disturbance $f_{ext}$ on the relative displacement ($x_1 - x_2$) obtained by position detection of the stage.

Thus, the transfer functions from the disturbance $f_{ext}$ to the relative displacement ($x_1 - x_2$) in the absence of the acceleration feedback and in setting an optimum feedback gain according to the equation (12) assume the following forms:

(1) In the absence of acceleration feedback:

$$(x_1 - x_2)/f_{ext} = \{-m_1 s^3 (1 + sT_d)\} / \{sg''(s) + \tag{14}$$

$$K_p K_t K_i (1 + sT_a)[(m_1 + m_2)s^2 + b_2 s + k_2](F_{vs} + F_{xs} + F_l)\}$$

(2) With the optimum acceleration feedback:

$$(x_1 - x_2)/f_{ext} = \{-m_1 s^4 (T_a + T_d + sT_a T_d)\} / \{sg'(s) + \tag{15}$$

$$K_p K_t K_i (1 + sT_a)[(m_1 + m_2)s^2 + b_2 s + k_2](F_{vs}^2 + F_{xs} + F_l)\}$$

A comparison of the numerators of the equations (14) and (15) indicates that the order of the equation in the numerator is lower by one in the equation (14). Also the numerical analysis and the measured frequency response indicate that the dominant poles of the characteristic equations of the position control system are scarcely affected by the presence or absence of feedback. Thus, the comparison of the order of the numerators of the equations (14) and (15) indicates that the response of the low frequency components is suppressed in comparison with the case without the feedback, by optimum setting of the gain such as is acquired by equation (12).

Figure 8A:
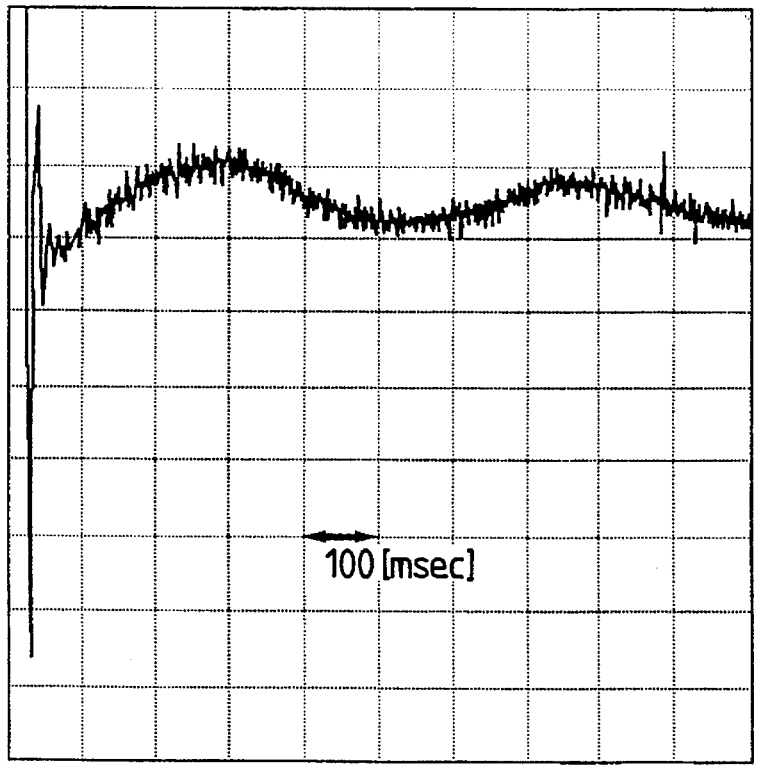
FIG. 8A is a waveform chart showing the step response of a movable stage loaded on a base plate in case the acceleration signal of the base plate is not fed back.
Figure 8B:
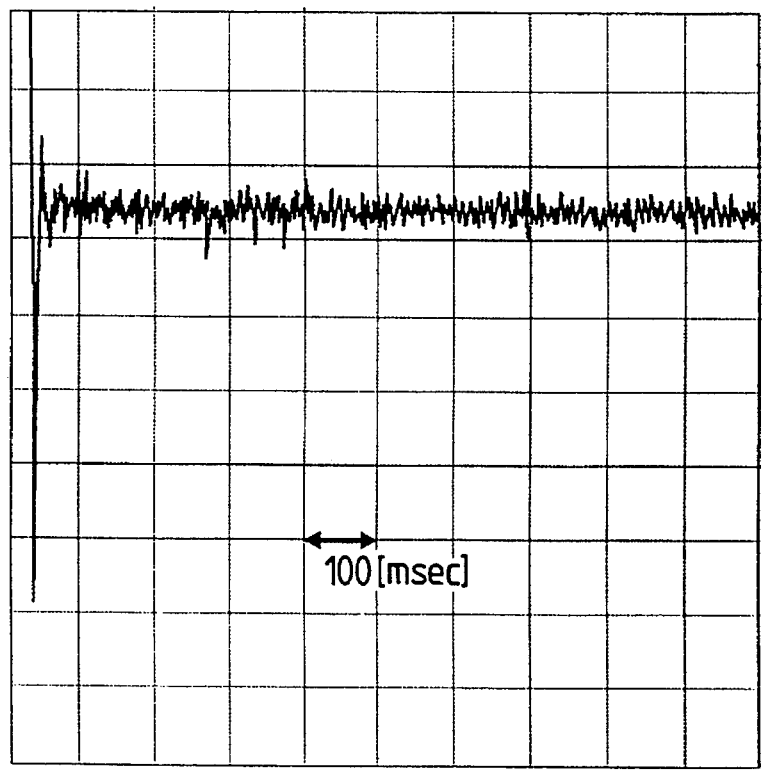
FIG. 8B is a waveform chart showing the step response of a movable stage loaded on a base plate in case the acceleration signal of the base plate is fed back.

The foregoing numerical relations are verified experimentally, by the step response wave form of the stage in the presence and absence of the base plate acceleration feedback. FIG. 8A shows the error output of the position control system in the step response of the stage, without the base plate acceleration feedback. In this case, there is observed a transient oscillation with the natural frequency of the position control system, followed by a prolonged vibration with the natural frequency of the base plate mechanism. On the other hand, FIG. 8B shows a case in which the base plate acceleration feedback is set with substantially optimum conditions. Though a transient vibration occurs also with the specific frequency of the control system in the initial stage of the step response, the subsequent vibration with the specific frequency of the base plate mechanism is satisfactorily suppressed.

The foregoing embodiment relates to the case in which stages alone are mounted on the base plate, and is used to improve the precision of positioning and the time required therefor, in the presence of a disturbance. However, in a position device including a fine movement stage on a coarse movement stage mounted on the base plate, the performance of the uppermost fine movement stage plays an important role. Such a situation will be quite obvious in case such position device is a stepper. More specifically, an improvement in the precision of printing on a wafer cannot be achieved by the improvement in the positioning performance of the coarse movement stage against the disturbance, unless the positioning performance of the fine movement stage mounted thereon is also likewise considered. Stated differently, what finally matters is not the positioning precision of the coarse movement stage, but the printing accuracy. In order to improve the printing accuracy, it is necessary to improve the positioning precision of the fine movement stage, which directly positions the wafer present in the uppermost position.

The following embodiment is provided in consideration of the foregoing, and the object thereof is, in a positioning device comprising a coarse movement stage mounted on a base plate and a fine movement stage provided thereon, to cancel or to significantly reduce the influence of a disturbance, applied to the base plate, on the positioning performance of said fine movement stage and the coarse movement stage.

The present embodiment provides a position control device capable of multiple acceleration feedbacks by detecting the acceleration of the base plate and adding the acceleration to the driving force for the coarse movement stage, and also detecting the acceleration of the coarse movement stage and adding the acceleration to the driving force for the fine movement stage.

Figure 9:
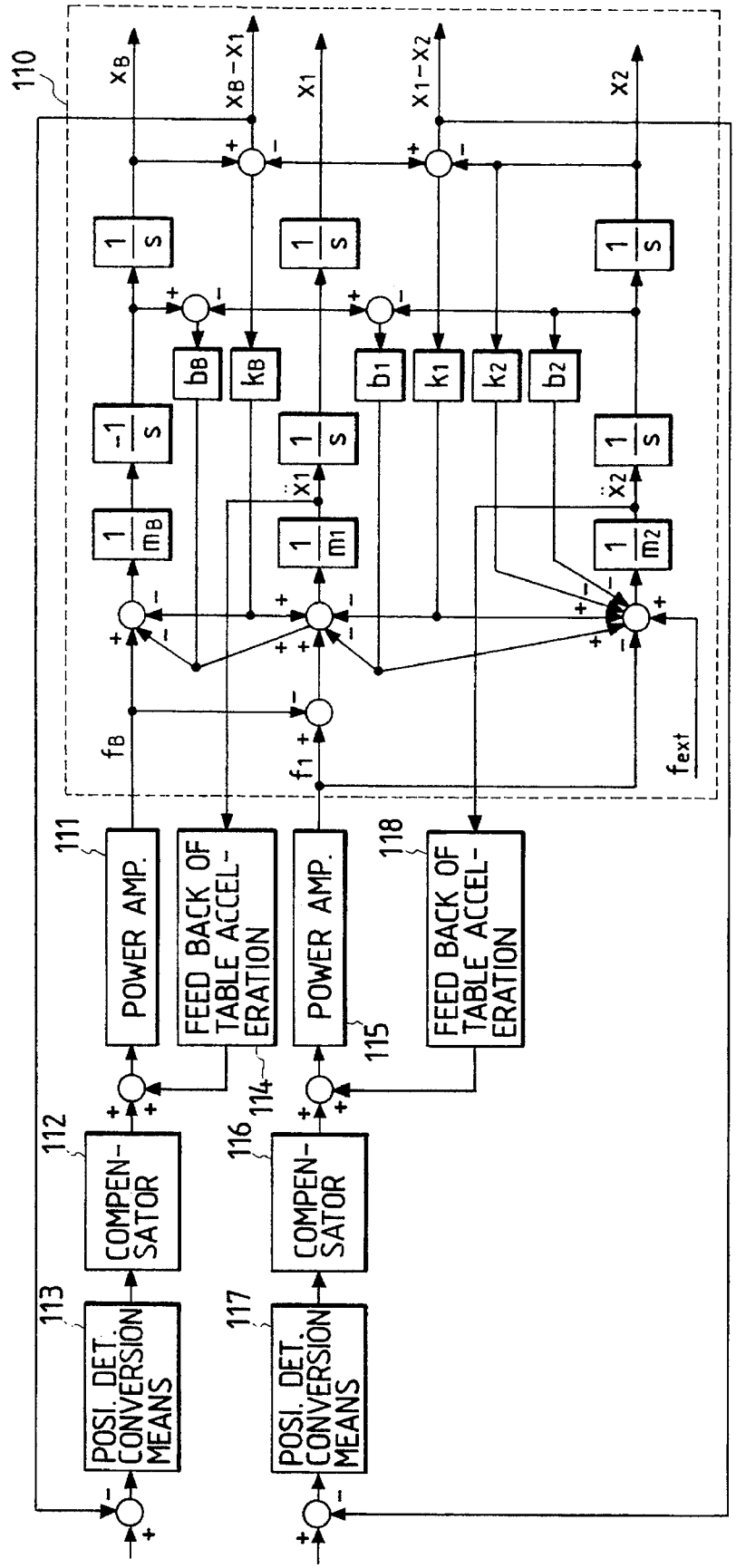
FIG. 9 is a block diagram of a position control system of another embodiment of the present invention.

FIG. 9 is a control block diagram of the position control system for providing composite acceleration feedback to a positioning device for an exposure apparatus, constituting an embodiment of the present invention and consisting of a base plate, a coarse movement stage and a fine movement stage for supporting a wafer or a substrate to be exposed. Prior to the explanation of the system shown in FIG. 9, the related technology will be explained by a dynamic model, with a horizontal axis, of the positioning device consisting, as shown in FIG. 10, of a base plate, a coarse movement stage and a fine movement stage.

Figure 10:
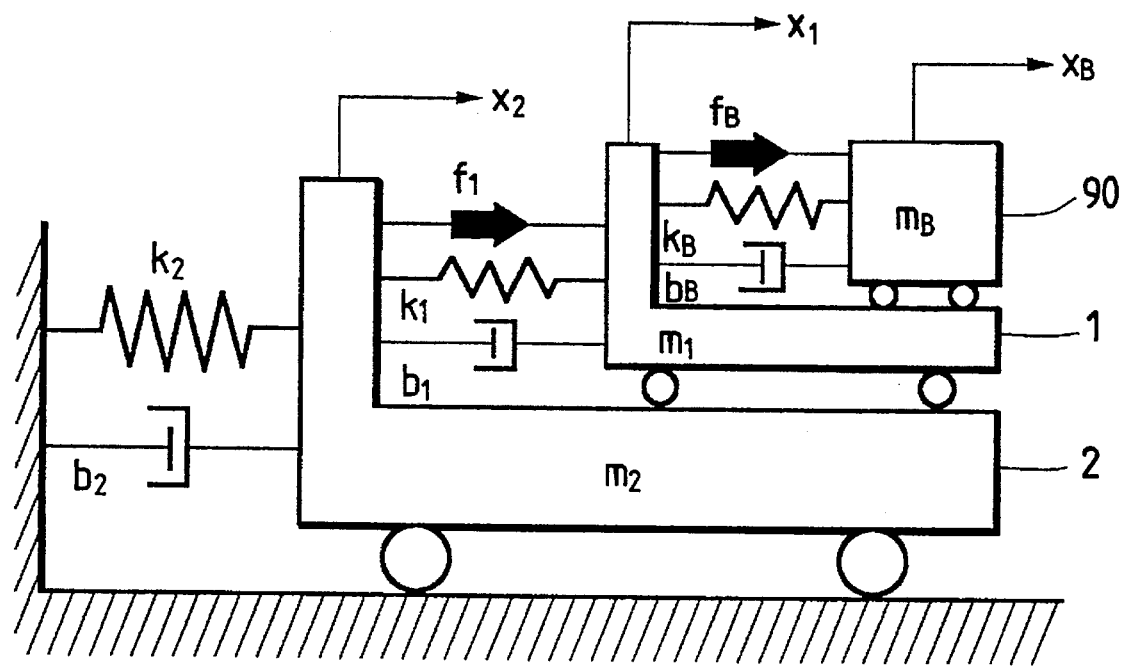
FIG. 10 is a schematic view of a dynamic model, in any of horizontal directions, of a system in which a coarse movement stage equipped with a fine movement stage is loaded on a base plate.

FIG. 10 shows a dynamic model in which a coarse movement stage 1 is mounted on a base plate 2, and a fine movement stage 90 is mounted on said coarse movement stage 1. The following equations of motion are obtained with the symbols shown in FIG. 10:

$$m_B \ddot{x}_B + b_B(\dot{x}_B - \dot{x}_1) + k_B(x_B - x_1) = f_B \tag{16a}$$

$$m_1 \ddot{x}_1 + b_1(\dot{x}_1 - \dot{x}_2) + k_1(x_1 - x_2) + b_B(\dot{x}_1 - \dot{x}_B) + k_B(x_1 - x_B) = f_1 - f_B \tag{16b}$$

$$m_2 \ddot{x}_2 + b_2 \dot{x}_2 + k_2 x_2 + b_1(\dot{x}_2 - \dot{x}_1) + k_1(x_2 - x_1) = -f_1 + f_{ext} \tag{16c}$$

wherein the symbols of these equations have the same meanings as in the equation (3), and additional symbols have the following meaning:

$m_B$: mass of fine movement stage [kg]

$b_B$: viscous friction coefficient of fine movement stage [Ns/m]

$k_B$: spring constant of fine movement stage [N/m]

$x_B$: displacement of fine movement stage [m]

$f_B$: driving force for fine movement stage [N]

The equations (16a)–(16c) can be represented, in a block diagram representation, by a controlled object 110, indicated by a broken-lined frame in FIG. 9. In FIG. 9 there are provided a power amplifier 111 for driving the fine movement stage 90; a compensating circuit 112 for improving the characteristics of the position control system of the fine movement stage 90; position detection/conversion means 113; a power amplifier 115 for driving the coarse movement stage 1; a compensating circuit 116 for improving the characteristics of the position control system for the coarse movement stage 1; and position conversion means 117. The above-mentioned position control system is further provided with a multiple acceleration feedback system for guiding the acceleration $\ddot{x}_1$ of the coarse movement stage 1 to a coarse movement stage acceleration feedback circuit 14 and adding the same to the input of the power amplifier 111, and also guiding the acceleration $\ddot{x}_2$ of the base plate 2 to a base plate acceleration feedback circuit 118 and adding the same to the input of the power amplifier 115. The effect of such composite acceleration feedback will be shown as follows.

In the following, based on the equivalent character of the equations (8) and (12), there will be given equations when the acceleration feedback for the base plate and the coarse movement stage are simultaneously applied to the controlled object 110 consisting of the base plate acceleration feedback and the coarse movement stage. Thus, the following discussion considers a state without the control loop for position or speed, for the coarse movement stage and for the fine movement stage.

Figure 11:
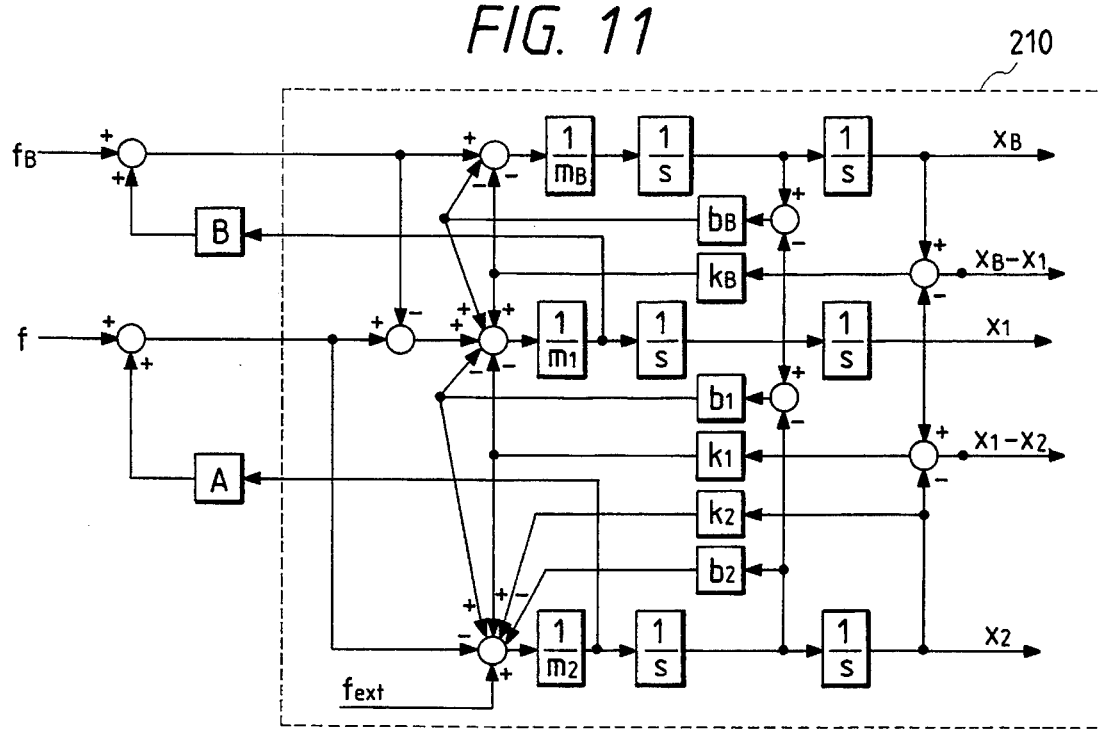
FIG. 11 is a block diagram of the position control system of the movable stage of the system shown in FIG. 10, wherein the acceleration signal of the base plate is fed back to the driving of the coarse movement stage and the acceleration signal thereof is fed back to a driving unit for the fine movement stage.

When the multiple acceleration feedback is applied to the dynamic model shown in FIG. 10, there are obtained following equations of motion and a block diagram shown in FIG. 11:

$$m_B\ddot{x}_B + b_B(\dot{x}_B - \dot{x}_1) + k_B(x_B - x_1) = f_B + B\ddot{x}_1 \quad (17a)$$

$$m_1\ddot{x}_1 + b_1(\dot{x}_1 - \dot{x}_2) + k_1(x_1 - x_2) + b_B(\dot{x}_1 - \dot{x}_B) + k_B(x_1 - x_B) = f_1 + A\ddot{x}_2 - f_B - B\ddot{x}_1 \quad (17b)$$

$$m_2\ddot{x}_2 + b_2\dot{x}_2 + k_2x_2 + b_1(\dot{x}_2 - \dot{x}_1) + k_1(x_2 - x_1) = -f_1 - A\ddot{x}_2 + f_{ext} \quad (17c)$$

Simple calculations provide transfer functions from the disturbance $f_{ext}$ to the relative displacement, $(x_B - x_1)$ and $(x_1 - x_2)$ in the following equations:

$$(x_B - x_1)/f_{ext} = \{(As^2 + b_1s + k_1)(B - m_B)s^2\}/D'(s) \quad (18a)$$

$$(x_1 - x_2)/f_{ext} = \{(m_Bs^2 + b_Bs + k_B)[\{A - (m_1 + B)\}s^2 - b_Bs - k_B]\}/D'(s) \quad (18b)$$

$$D'(s) = (m_Bs^2 + b_Bs + k_B)\{(m_1 + B)s^2 + (b_1 + b_B)s + (k_1 + k_B)\}\{(A + m_2)s^2 + (b_1 + b_2)s + (k_1 + k_2)\} - (m_Bs^2 + b_Bs + k_B)(As^2 + b_1s + k_1)(b_1s + k_1) - \{(A + m_2)s^2 + (b_1 + b_2)s + (k_1 + k_2)\}(Bs^2 + b_Bs + k_B)(b_Bs + k_B) \quad (18c)$$

The equation (18a) indicates that the influence of the disturbance $f_{ext}$ on the relative displacement $(x_B - x_1)$ can be reduced to zero by selecting the gain B of the acceleration feedback of the coarse movement stage as:

$$B = m_B \quad (19).$$

Also, the equation (16b) indicates that the influence of the disturbance $f_{ext}$ on the relative displacement $(x_1 - x_2)$ can be reduced by selecting the gain A of the acceleration feedback of the base plate as:

$$A = m_1 + B = m_1 + m_B \quad (20).$$

Stated differently, the optimum value of gain B of the acceleration feedback of the coarse movement stage corresponds to the mass of the movable part of the fine movement stage 90 mounted on the coarse movement stage 1, and the optimum value of the gain A of the acceleration feedback of the base plate corresponds to the total mass of the coarse movement stage 1 and the fine movement stage 90 mounted on the base plate. By optimizing the composite acceleration feedback as explained above, the influences on the coarse movement stage and the fine movement stage resulting from the disturbance applied to the base plate can be simultaneously eliminated or reduced.

The equations (19) and (20) apply also when a control system is constructed for the fine movement stage 90 and the coarse movement stage 1. This fact was already demonstrated in the derivation of the equations (8) and (12). Consequently, the suppressing effect of the multiple acceleration feedback on the influence of the disturbance remains also when position control systems are provided for the fine movement stage 90 and the coarse movement stage 1 as shown in FIG. 9.

Figure 12:
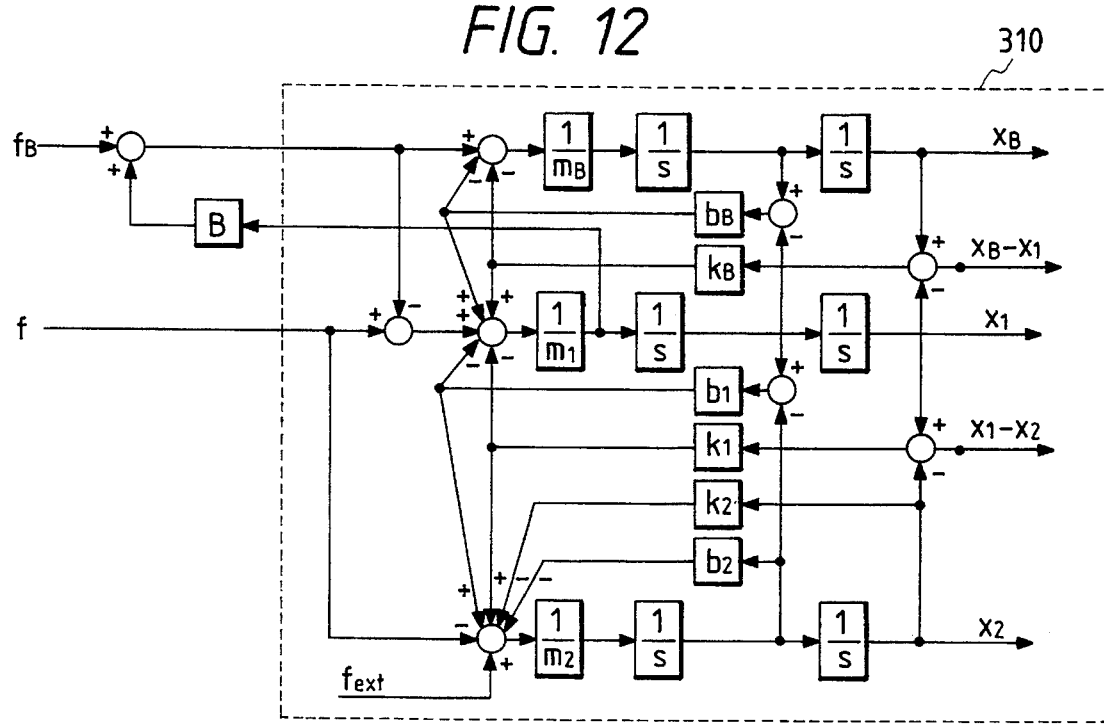
FIG. 12 is a block diagram of the position control system of the movable stage of the system shown in FIG. 10, wherein the acceleration signal of the coarse movement stage is fed back to the driving of the fine movement stage.

In the foregoing embodiment, the feedback of the coarse movement stage acceleration and of the base plate acceleration are simultaneously applied, respectively, to the fine movement stage 90 and the coarse movement stage 1. However, there may only be applied the feedback of the coarse movement stage acceleration to the fine movement stage 90, as shown in FIG. 12. In such case, the transfer function from the disturbance $f_{ext}$ applied to the base plate to the relative displacement $(x_B - x_1)$ is represented as follows:

$$(x_B - x_1)/f_{ext} = (b_1s + k_1)(B - m_B)s^2/D(s) \quad (21a)$$

$$D(s) = (m_Bs^2 + b_Bs + k_B)\{(m_1 + B)s^2 + (b_1 + b_B)s + (k_1 + k_B)\}\{(m_2s^2 + (b_1 + b_2)s + (k_1 + k_2)\} - (m_Bs^2 + b_Bs + k_B)(b_1s + k_1)^2 - \{m_2s^2 + (b_1 + b_2)s + (k_1 + k_2)\}(Bs^2 + b_Bs + k_B)(b_Bs + k_B) \quad (21b)$$

The meaning of the foregoing equations is same as that of the equations (8) or (18a). The influence of the disturbance $f_{ext}$ applied on the base plate can be cancelled by selecting the gain B of the acceleration feedback of the coarse movement stage to be equal to the mass $m_B$ of the fine movement stage.

In contrast to conventional technology dealing with a coarse movement stage consisting of a single movable mechanism mounted on the base plate, the present embodiment deals with a positioning device consisting of three movable mechanisms. In this configuration, the influence of the disturbance $f_{ext}$, applied to the base plate, to the uppermost fine movement stage can be alleviated by adding the acceleration of the coarse movement stage, present as the intermediate stage, to the driving force for the fine movement stage.

In the foregoing embodiment, the base plate constitutes a passive antivibration unit, but it may be an active antivibration device. Thus, also in a configuration of the positioning device consisting of an active antivibration device, a coarse movement stage mounted thereon and a fine movement stage provided thereon, the composite acceleration feedback is effective for reducing the influence of the disturbance applied to the active antivibration device.

As explained in the foregoing, in a positioning device provided with three movable mechanisms, the foregoing embodiment is capable of simultaneously alleviating the influence of the disturbance, applied to the base plate, on the positioning characteristics of the uppermost fine movement stage and on those of the intermediate coarse movement stage. Consequently, if the positioning device is employed in the X-Y stage driving system of a stepper, there can be improved the precision of printing on a wafer, whereby obtained are an improvement in the productivity and production yield, and a reduction in cost, of IC chips.

Figure 13:
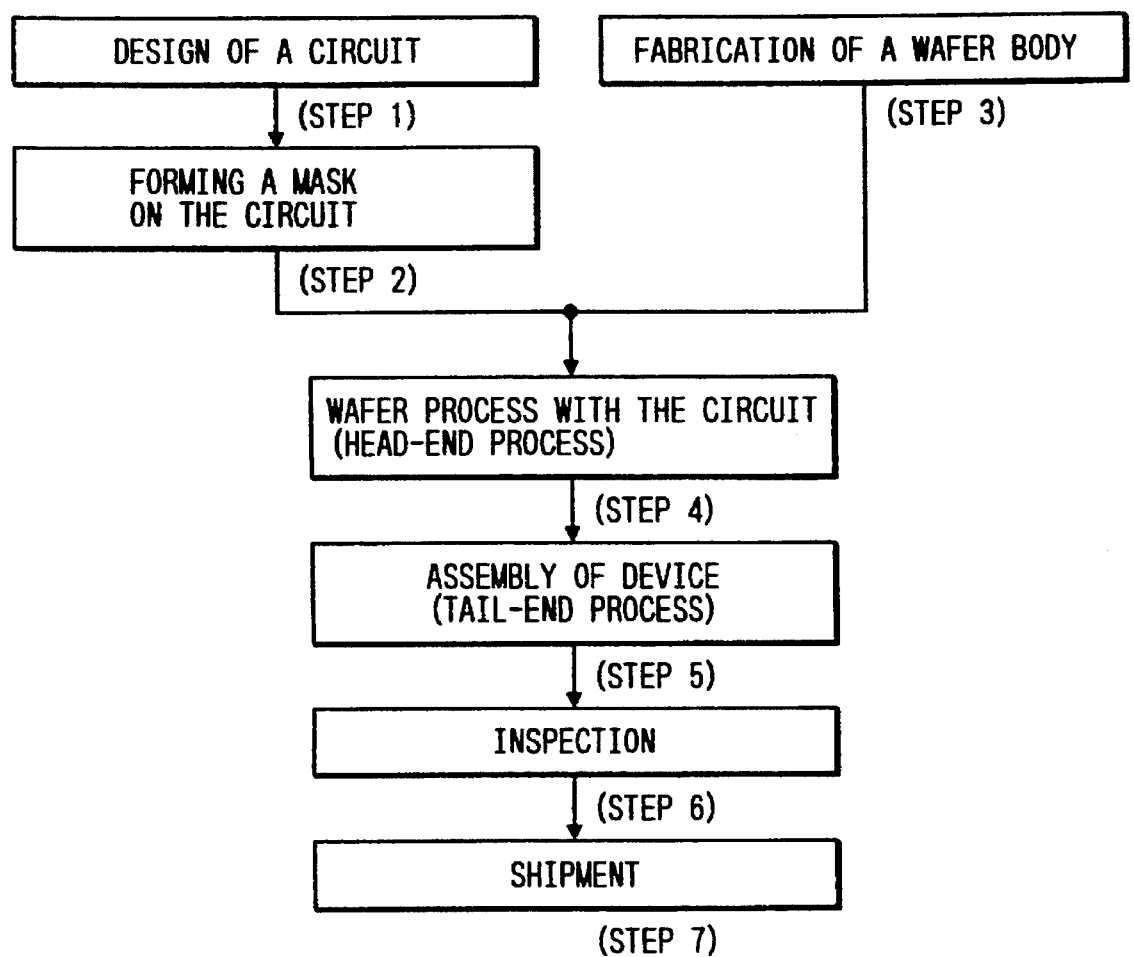
FIG. 13 is a chart showing the flow of manufacture of a semiconductor device.

In the following there will be explained an example of manufacturing method for semiconductor devices, utilizing the exposure apparatus explained above. FIG. 13 is a flow chart of the manufacturing process for a semiconductor device (a semiconductor chip such as IC or LSI, a liquid crystal display panel or a CCD). A step 1 (circuit design) effects circuit designing for the semiconductor device. A step 2 (mask preparation) prepares a mask bearing a pattern of the designed circuits. On the other hand, a step 3 (wafer preparation) prepares a wafer, utilizing silicon or the like. A step 4 (wafer process), called a front-end process, the thus prepared wafer and mask and forms the actual circuits on the wafer by a photolithographic process. A next step 5 (assembly), called rear-end process, prepares a semiconductor chip from the wafer processed in the step 4, and includes an assembly step (dicing and bonding), a packaging step (chip sealing) etc. A step 6 (inspection) effects inspections such as a test for confirming the function and a test for confirming the durability of the semiconductor device prepared in the step 5. The semiconductor device is completed through these steps and is shipped out (step 7).

Figure 14:
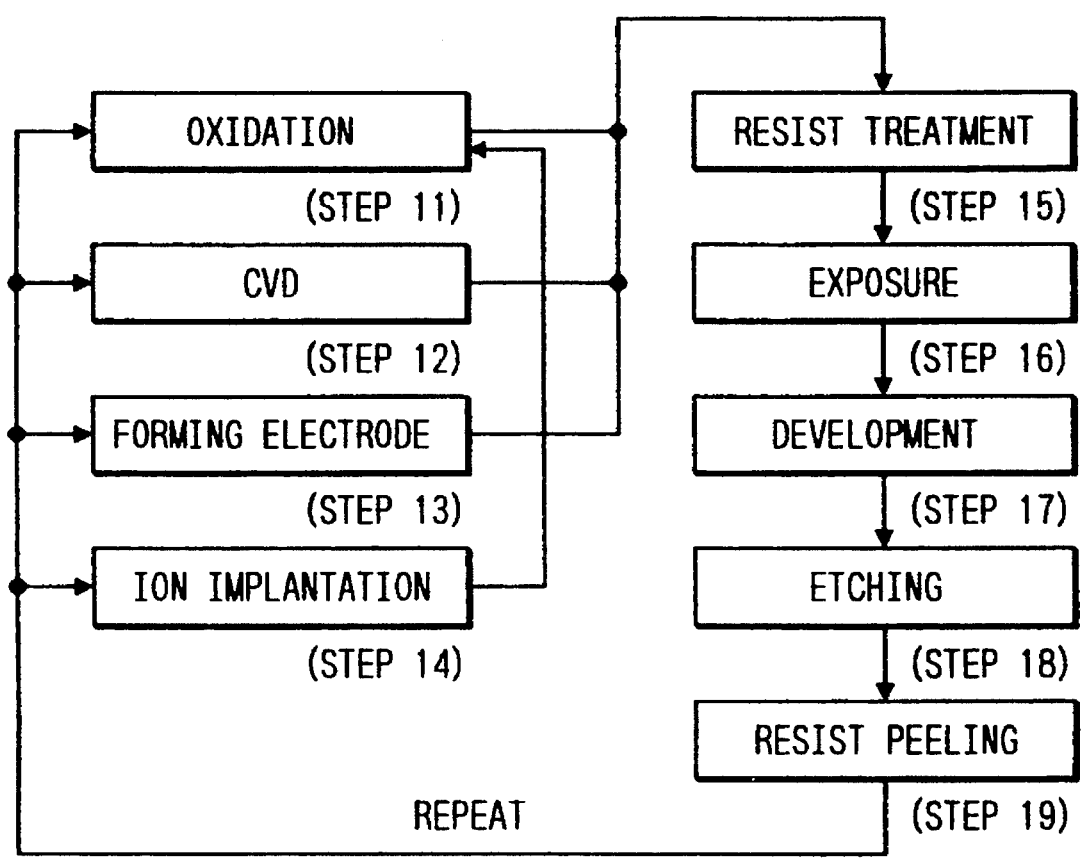
FIG. 14 is a detailed flow chart of a wafer process.

FIG. 14 shows the detailed flow of the wafer process. A step 11 (oxidation) oxidizes the surface of the wafer. A step 12 (CVD) forms an insulation film on the wafer surface. A step 13 (electrode formation) forms electrodes on the wafer by the evaporation process. A step 14 (ion implantation) implants ions into the wafer. A step 15 (resist process) coats a photosensitive material onto the wafer. A step 16 (exposure) exposes the wafer to the circuit pattern of the mask, employing the above-explained exposure apparatus. A step 17 (development) develops the exposed wafer. A step 18 (etching) etches off the portions other than the developed photoresist image. A step 19 (resist stripping) removes the resist, which has become unnecessary after the etching. Circuit patterns are formed in multiple layers on the wafer, by the repetition of these steps.

What is claimed is:

1. A device comprising:

a base member;

a first movable member provided on said base member;

a second movable member movable relative to said first movable member, provided on said first movable member;

first detection means for detecting the acceleration of said first movable member; and control means for controlling the displacement of said second movable member by utilizing the acceleration information detected by said first detection means.

2. A device according to claim 1, further comprising a damping device for supporting said base member.

3. A device comprising:

a base member;

a first movable member provided on said base member;

a second movable member movable relative to said first movable member, provided on said first movable member;

first detection means for detecting the acceleration of said first movable member; and control means for controlling the displacement of said second movable member so as to reduce the time required for positioning said second movable member at a target position by utilizing the acceleration information detected by said first detection means.

4. A device according to claim 3, further comprising damping device for supporting said base member.

5. A device comprising:

a base member;

a first movable member provided on said base member;

a second movable member movable relative to said first movable member, provided on said first movable member;

first detection means for detecting the acceleration of said base member;

second detection means for detecting the acceleration of said first movable member; and control means for controlling the displacement of said first movable member in such a manner as to reduce the time required for positioning said first movable member at a target position by utilizing the acceleration information detected by said first detection means, and controlling the displacement of said second movable member so as to reduce the time required for positioning said second movable member at a target position, utilizing the acceleration information detected by said second detection means.

6. A device according to claim 5, further comprising damping device for supporting said base member.

7. An exposure apparatus comprising:

a base member;

a damping device for supporting said base member;

a first movable stage provided on said base member;

a second movable stage movable relative to said first stage provided on said first movable stage, for supporting a substrate to be exposed;

first detection means for detecting the acceleration of said first movable stage; and control means for controlling the displacement of said second movable stage so as to reduce the time required for positioning said second movable stage at a target position, utilizing the acceleration information detected by said first detection means.

8. An exposure apparatus comprising:

a base member;

a damping device for supporting said base member;

a first movable stage provided on said base member;

a second movable member provided on said first movable stage;

first detection means for detecting the acceleration of said base member;

second detection means for detecting the acceleration of said first movable member; and control means for controlling the displacement of said first movable stage so as to reduce the time required for positioning said first movable stage at a target position by utilizing the acceleration information detected by said first detection means, and controlling the displacement of said second movable stage so as to reduce the time required for positioning said second movable stage at a target position by utilizing the acceleration information detected by said second detection means.

9. A method for fabricating a device by placing a substrate to be exposed on a second movable stage, provided on a first movable stage positioned on a base member and exposing the substrate placed on the second movable stage comprising the steps of:

controlling the displacement of the second movable stage so as to reduce the time required for positioning the second movable stage at a target position; and utilizing the acceleration information of the first movable stage to control displacement of said second movable stage in said controlling step.

10. A method for fabricating a device by placing a substrate to be exposed on a second movable stage, provided on a first movable stage positioned on a base member and exposing the substrate placed on the second movable stage, comprising the steps of:

controlling the displacement of the second movable stage so as to reduce the time required for positioning the second movable stage at a target position by utilizing the acceleration information of the first movable stage; and controlling the displacement of the first movable stage so as to reduce the time required for positioning the first movable stage at a target position, utilizing the acceleration information of said base member.

* * * * *

UNITED STATES PATENT AND TRADEMARK OFFICE
CERTIFICATE OF CORRECTION

PATENT NO. : 5,504,407
DATED : April 2, 1996
INVENTOR(S) : SHINJI WAKUI, ET AL.

It is certified that error appears in the above-indentified patent and that said Letters Patent is hereby corrected as shown below:

COLUMN 2:

Line 31, "following" should read --the following--.

COLUMN 3:

Line 42, "foregoing" should read --the foregoing--.
Line 46, "plate:" should read --plate;--.

COLUMN 4:

Line 38, "said" should read --the--.
Line 43, "of of" should read --of--.

COLUMN 5:

Line 3, "exist" should read --exists--.
Line 26, "difference. Between" should read --difference between--.
Line 53, "force" should read --forces--, and "stage" should read --stages--.
Line 64, "cancel," should read --cancel", and "out" should read --out,--.

UNITED STATES PATENT AND TRADEMARK OFFICE
CERTIFICATE OF CORRECTION

PATENT NO. : 5,504,407
DATED : April 2, 1996
INVENTOR(S) : SHINJI WAKUI, ET AL.

It is certified that error appears in the above-indentified patent and that said Letters Patent is hereby corrected as shown below:

COLUMN 6:

Line 51, "following" should read --the following--.

COLUMN 7:

Line 11, "$\chi_2=\{m_2s^2f_1$" should read --$\chi_2=\{-m_1s^2f_1$--.

Line 16, "as" should read --in the--.

Line 17, "by" should read --from--.

Line 53, "$f_{ext}$ $f_{ext}$" should read --$f_{ext}$--.

COLUMN 8:

Line 9, "following" should read --the following--.

Line 27, "circuit 8" should read --circuit 80--.

Line 36, "circuit 8" should read --circuit 80--.

Line 65, "following" should read --the following--.

UNITED STATES PATENT AND TRADEMARK OFFICE
CERTIFICATE OF CORRECTION

PATENT NO. : 5,504,407
DATED : April 2, 1996
INVENTOR(S) : SHINJI WAKUI, ET AL.

It is certified that error appears in the above-indentified patent and that said Letters Patent is hereby corrected as shown below:

COLUMN 10:

Line 27, "said" should read --the--.

COLUMN 11:

Line 2, "diagram representation," should read --diagram,--.

Line 29, "obtained" should read --obtained the--.

Line 35, "$=f_1+A\tilde{\chi}_2-f_B-B\ell$ (17b)" should read --$f_1+A\tilde{\chi}_2-f_B-B\tilde{\chi}_1$ (17b)--.

COLUMN 12:

Line 39, "distrubance" should read --disturbance--.

UNITED STATES PATENT AND TRADEMARK OFFICE
CERTIFICATE OF CORRECTION

PATENT NO. : 5,504,407
DATED : April 2, 1996
INVENTOR(S) : SHINJI WAKUI, ET AL.

It is certified that error appears in the above-indentified patent and that said Letters Patent is hereby corrected as shown below:

<u>COLUMN 13</u>:

Line 16, ", the thus" should read --utilizes the thus--.

Line 19, "called rear-end" should read --called a rear-end--.

Line 31, "by the" should read --by an--.

<u>COLUMN 14</u>:

Line 5, "damping" should read --a damping--.

Line 27, "damping" should read --a damping--.

Signed and Sealed this

Thirteenth Day of August, 1996

*Attest:*

BRUCE LEHMAN

*Attesting Officer*   *Commissioner of Patents and Trademarks*